United States Patent [19]
Ohtsuka et al.

[11] Patent Number: 5,814,838
[45] Date of Patent: Sep. 29, 1998

[54] LIGHT EMITTING SEMICONDUCTOR ELEMENT WITH ZN DOPING

[75] Inventors: Koji Ohtsuka, Kawagoe; Hitoshi Murofushi, Sagamihara; Emiko Chino, Kawagoe; Tetsuji Moku, Asaka, all of Japan

[73] Assignee: Sanken Electric Co., Ltd., Saitama-ken, Japan

[21] Appl. No.: 856,946

[22] Filed: May 15, 1997

[30] Foreign Application Priority Data

May 22, 1996 [JP] Japan ................................. 8-151537
Apr. 4, 1997 [JP] Japan ................................. 9-102463

[51] Int. Cl.$^6$ .................................................. H01L 33/00
[52] U.S. Cl. .............................. 257/94; 257/96; 257/97; 257/102; 257/103; 372/43; 372/44; 372/45
[58] Field of Search .................... 257/94, 96, 97, 257/102; 372/43, 44, 45

[56] References Cited

U.S. PATENT DOCUMENTS 5,411,915   5/1995   Hamada et al. ........................ 437/129
5,617,438   4/1997   Hatano et al. ............................ 372/45
5,631,475   5/1997   Watabe et al. ............................ 257/94
5,661,741   8/1997   Kakimoto ................................. 372/46
5,677,922   10/1997  Hayafusi et al. ......................... 372/49

*Primary Examiner*—William Mintel
*Attorney, Agent, or Firm*—Woodcock Washburn Kurtz Mackiewicz & Norris LLP

[57] ABSTRACT

An LED is disclosed which has a laminated semiconductor body with an anode and a cathode formed on a pair of opposite faces thereof. Among the layers of the semiconductor body are an active layer of AlGaInP semiconductor material, an n type cladding layer of either n type AlGaInP or n type AlInP semiconductor material on one side of the active layer, and a p type cladding layer of p type AlGaInP or p type AlInP semiconductor material on another side of the active layer. Unlike the conventional belief that the active layer should be as free as possible from the infiltration of Zn used in the p type cladding layer as an impurity to determine its p conductivity type, and hence as high in crystallinity as possible, Zn is positively doped into the active layer with a concentration of $1\times10^{16}$–$5\times10^{17}$ cm$^{-3}$.

5 Claims, 2 Drawing Sheets

LIGHT EMITTING SEMICONDUCTOR ELEMENT WITH ZN DOPING

BACKGROUND OF THE INVENTION

This invention relates to light emitting semiconductor elements, or light emitting diodes (LEDs) according to more common parlance, which serve as light sources when voltage is applied and which thus lend themselves to use for a variety of display or illumination purposes.

LEDs have been known and used extensively which have a multi-layer semiconductor body sandwiched between an anode and a cathode. The present invention has particular pertinence to those LEDs whose semiconductor body is a lamination of an n type gallium arsenide (GaAs) semiconductor substrate, an n type GaAs semiconductor buffer layer, an n type aluminum indium phosphide (AlInP) cladding layer, an aluminum gallium indium phosphide (AlGaInP) semiconductor active layer, a p type AlInP semiconductor cladding layer, a p type aluminum gallium arsenide (AlGaAs) semiconductor current spreading layer, a $p^+$ AlGaInP semiconductor protective layer for prevention of oxidation, a p type GaAs semiconductor contacting layer, and an n type AlGaInP semiconductor current blocking layer. An anode has been formed next to the contacting layer, and a cathode next to the substrate. Light is emitted from that part of the $p^+$ type AlInP semiconductor cladding layer which is left uncovered by the anode.

Typically, the n type AlInP semiconductor cladding layer has been doped with silicon as an impurity that determines the n conductivity type. The p type AlInP semiconductor cladding layer has been doped with zinc (Zn) as an impurity that determines the p conductivity type. Although itself not doped with Zn, the AlGaInP semiconductor active layer was partly infiltrated with the Zn that has been doped into the neighboring p type cladding layer. Usually, the Zn infiltration into the active layer has been to a depth of 0.1 micrometer or so, or up to one fifth of the thickness of the active layer.

The conventional belief was that the Zn presence in the active layer did harm to its crystallinity, increased recombinations that did not result in light emission, and thus lowered the efficiency of the complete LED. Consequently, the active layer was of course not positively doped with Zn, and attempts were made to reduce the Zn infiltration from the p type cladding layer to a minimum. Despite such conventional efforts to maintain the crystallinity of the active layer, the LEDs of this kind were not as high in efficiency as could be desired.

SUMMARY OF THE INVENTION

The present invention seeks to improve the efficiency of the light emitting semiconductor elements or LEDs of the kind defined.

Briefly, the invention may be summarized as a light emitting semiconductor element having a semiconductor body having a plurality of laminated semiconductor layers for emitting light, a cathode on one face of the semiconductor body, and an anode on another face of the semiconductor body. More specifically, the invention resides in the semiconductor body consisting essentially of an active layer of AlGaInP semiconductor material additionally having Zn approximately uniformly dispersed therein with a concentration of $1 \times 10^{16} - 5 \times 10^{17}$ cm$^{-3}$, the active layer being 0.5–2.0 micrometers thick, an n type cladding layer of either n type AlGaInP or n type AlInP semiconductor material on one side of the active layer, and a p type cladding layer of p type AlGaInP or p type AlInP semiconductor material on another side of the active layer.

The noted three semiconductor layers are given as essential parts of the semiconductor body in the fabrication of light emitting semiconductor elements according to the invention. Various other semiconductor layers may be added as required.

Experiment has proved that the positive doping of Zn into the active layer within the specified range of concentrations according to the present invention, as distinguished from accidental Zn infiltration into limited part of the active layer according to the prior art, materially reduces the amount of light emitted at wavelengths longer than the desired ones and, as a result, correspondingly increases the amount of light at the desired wavelengths.

Admittedly, the Zn doping adversely affects the crystallinity of the active layer and thus lessens the total amount of light produced. However, as far as the desired wavelength light is concerned, its amount is increased through the suppression of light emission at longer wavelengths, instead of being decreased through the drop in crystallinity.

The above and other features and advantages of this invention and the manner of realizing them will become more apparent, and the invention itself will best be understood, from a study of the following description and appended claims, with reference had to the attached drawings showing a preferred embodiment of the invention.

DESCRIPTION OF THE PREFERRED EMBODIMENT

Figure 1:
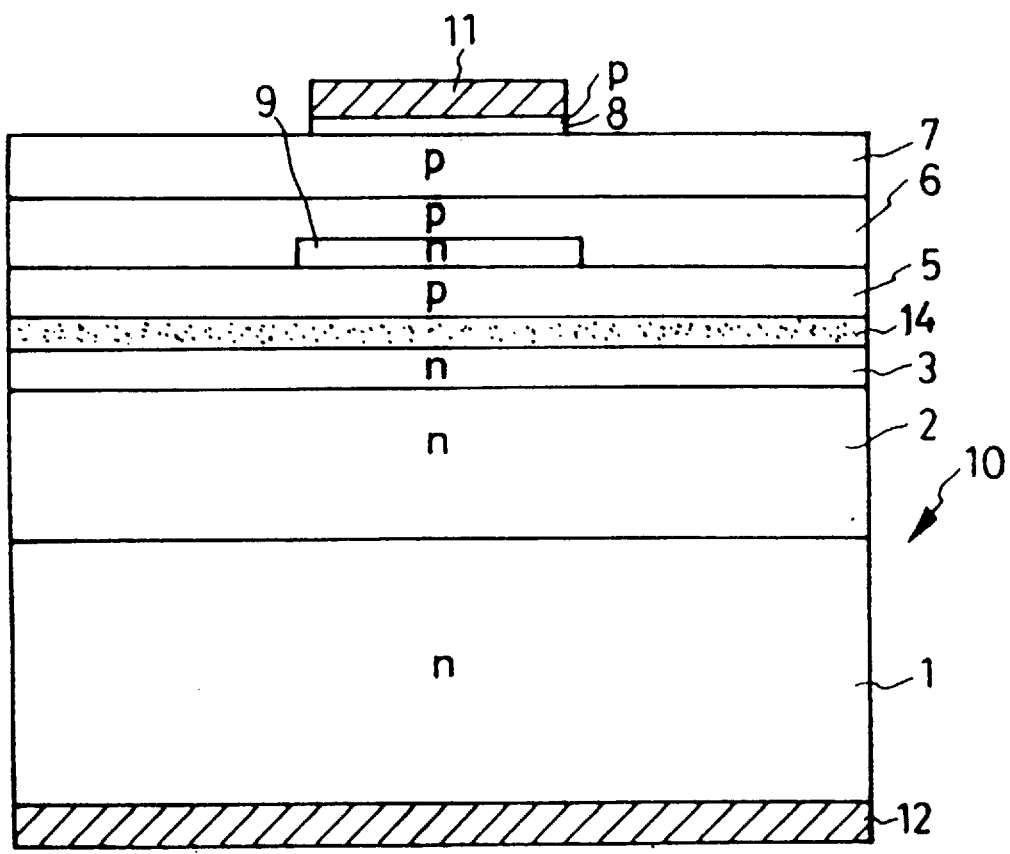
FIG. 1 is a diagrammatic illustration of an LED constructed in accordance with the present invention.

The present invention will now be described more specifically in terms of the LED illustrated in FIG. 1 by way of a representative embodiment of the invention. Broadly, the representative LED is a combination of a semiconductor body 10 having a pair of opposite faces, an anode 11 on one face of the semiconductor body, and a cathode 12 on the other face of the semiconductor body.

The semiconductor body 10 is a lamination of an n type GaAs semiconductor substrate 1, an n type GaAs semiconductor buffer layer 2, an n type AlInP semiconductor cladding layer 3, an AlGaInP semiconductor active layer 14, which additionally has Zn uniformly dispersed therein according to the novel concepts of the present invention, a p type AlInP semiconductor cladding layer 5, a p type AlGaAs semiconductor current spreading layer 6, a $p^+$ type AlGaInP semiconductor protective layer 7 for prevention of oxidation, and a p type GaAs semiconductor contacting layer 8 of smaller size, in that order from cathode 12 toward anode 11.

Additionally, an n type AlGaInP semiconductor current blocking layer 9, which is also less in size than all but the contacting layer 8 of the constituent layers of the semiconductor body 10, is interposed between cladding layer 5 and current spreading layer 6. Both contacting layer 8 and current blocking layer 9 are disposed centrally of the semiconductor body 10 as seen in a plan view. Thus the current blocking layer 9 contacts with only part of one side surface of the p type cladding layer 5, and the current spreading layer 6 contacts with both cladding layer 5 and current blocking layer 9.

The anode 11, which is made from gold (Au), is of approximately the same size as contacting layer 8 and overlies the same. Light is therefore emitted from that part of the protective layer 7 which is left uncovered by the anode 11.

Given hereafter is a more detailed description of the constituent layers of the semiconductor body 10. The substrate 1 is 330–370 micrometers thick and contains an impurity that determines its conductivity type, at a concentration of $1 \times 10^{18}$–$4 \times 10^{18}$ $cm^{-3}$.

The buffer layer 2 is 0.1–0.3 micrometer thick and contains an impurity that determines its conductivity type, at a concentration of $1 \times 10^{18}$–$5 \times 10^{18}$ $cm^{-3}$.

The n type cladding layer 3 is 0.5–1.5 micrometers thick and contains an impurity that determines its conductivity type, at a concentration of $8 \times 10^{16}$–$1 \times 10^{18}$ $cm^{-3}$.

The active layer 14 is 0.5–2.0 micrometers thick and contains Zn at a concentration of $1 \times 10^{16}$–$5 \times 10^{17}$ $cm^{-3}$.

The p type cladding layer 5 is 0.5–1.5 micrometers thick and contains an impurity that determines its conductivity type, at a concentration of $5 \times 10^{16}$–$1 \times 10^{18}$ $cm^{-3}$.

The current blocking layer 9 is 0.05–0.25 micrometer thick and contains an impurity that determines its conductivity type, at a concentration of $1 \times 10^{18}$–$1 \times 10^{19}$ $cm^{-3}$.

The current spreading layer 6, known also as the front window layer, is 5–15 micrometers thick and contains an impurity that determines its conductivity type, at a concentration of $1 \times 10^{18}$–$5 \times 10^{19}$ $cm^{-3}$.

The protective layer 7 is 0.2–0.4 micrometer thick and contains an impurity that determines its conductivity type, at a concentration of $1 \times 10^{17}$–$1 \times 10^{18}$ $cm^{-3}$.

The contacting layer 8 is 0.05–0.15 micrometer thick and contains an impurity that determines its conductivity type, at a concentration of $5 \times 10^{18}$–$7 \times 10^{19}$ $cm^{-3}$.

For the fabrication of the semiconductor body 10 of the foregoing configuration, there may first be conventionally prepared a combination of the substrate 1 and the buffer layer 2, the latter being formed by epitaxial growth of GaAs upon the former. Then, on this buffer layer 2, there may be epitaxially grown the n type AlInP cladding layer 3 containing silicon (Si) as an impurity that determines the n conductivity type. Immediately after the formation of the cladding layer 3, the impurity may be changed from Si to Zn, and the semiconductor substance may be changed from AlInP to AlGaInP for epitaxial growth on the cladding layer. It is possible in this manner to form continuously the cladding layer 3 and the AlGaInP semiconductor active layer 14, the latter being permeated with Zn throughout its body.

Then the cladding layer 5 may be formed on the active layer 14 by epitaxial growth of p type AlInP. As has been stated, the active layer 14 is 0.5–2.0 micrometers thick, which is sufficiently more than the depth (approximately 0.1 micrometer) of infiltration of Zn from the cladding layer 5. Then n type AlGaInP may be grown epitaxially on the cladding layer 5, and unnecessary part of the resulting product may be removed to provide the current blocking layer 9. Then the current spreading layer 6, the protective layer 7 and the contacting layer 8 may be formed one after another by epitaxial growth of p type AlGaAs semiconductor, AlGaInP semiconductor, and p type GaAs semiconductor.

Figure 2:
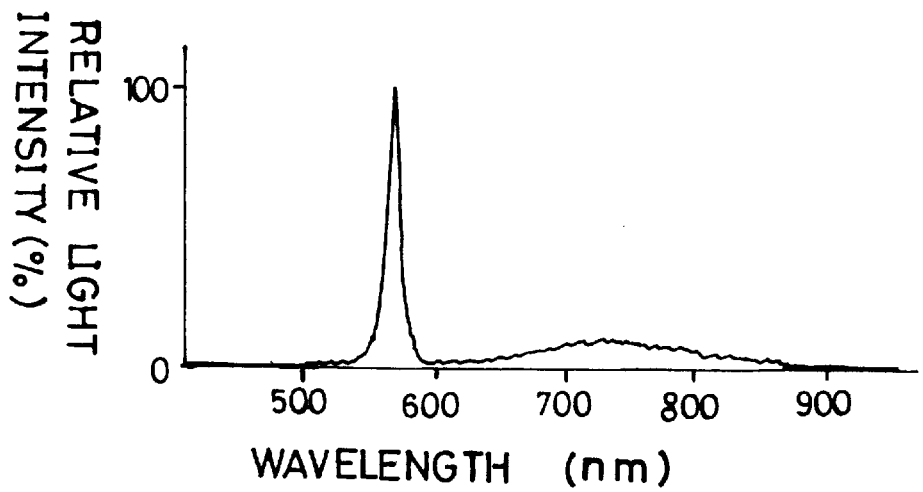
FIG. 2 is a graph plotting the curve of the relative intensity of the light produced by the noted prior art LED against the wavelength.

FIG. 2 graphically represents the intensity of light emitted by the prior art LED, having the active layer 4 not doped with Zn, at various wavelengths. In this graph, as well as in that of FIG. 3 which similarly demonstrates the performance of the LED having the active layer 14 doped with Zn according to the present invention, the light intensity is given in percentage with respect to the maximum intensity indicated, which is 100 percent. Both prior art and inventive LEDs were of course driven with current of the same magnitude in conducting the tests of FIGS. 2 and 3. The high intensity light at 570 nanometers and thereabouts in both FIGS. 2 and 3 is the desired green light.

The irregular intensity rises at 730 nanometers and thereabouts in FIG. 2 indicate dark red light due to deep emission according to the prior art. Such undesired emission lowers the efficiency of the LED at the desired wavelength. It has been confirmed that the intensity of the deep emission increases with an increase in x in the $(Al_xGa_{1-x})InP$ which constitutes the active layer, that is, with an increase in the energy gap of the active layer.

Figure 3:
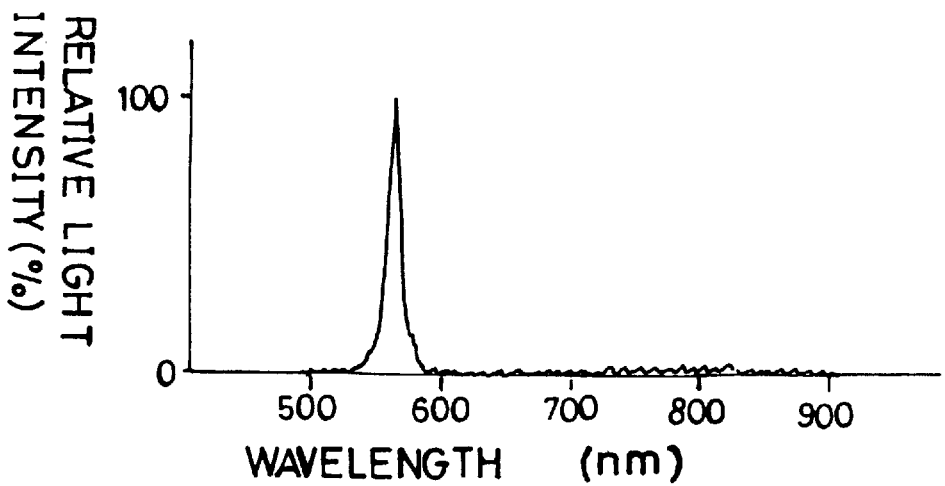
FIG. 3 is a graph plotting the curve of the relative intensity of the light produced by the FIG. 1 LED according to the invention against the wavelength.

FIG. 3 demonstrates that such deep emission can be virtually eliminated by uniformly doping Zn Into the active layer 14, resulting in the higher intensity of the light at the desired wavelength. Actually, the light intensity at the desired wavelength of the LED according to the present invention was more than twice that of the prior art device of like construction except that Zn was not uniformly doped Into the active layer.

Despite the foregoing detailed disclosure it is not desired that the invention be limited by the exact showing of the drawings or the description thereof. The following is a brief list of the possible modifications or alterations of the illustrated embodiment:

1. The n type cladding layer 3 and the p type cladding layer 5 could each be divided into two sublayers, and the potential barrier between the active layer 14 and that sublayer of each cladding layer which lies next to the active layer could be made higher than that between the active layer and the other sublayer of each cladding layer.
2. Both n and p type cladding layers 3 and 5 could be of AlGaInP instead of AlInP.
3. The Zn concentration of the active layer 14 could be anywhere between $1 \times 10^{16}$ $cm^{-3}$ and $5 \times 10^{17}$ $cm^{-3}$, no substantial improvement in efficiency being obtainable outside this range.
4. The active layer 14 could be anywhere between 0.5 and 2.0 micrometers in thickness. A drop in efficiency would result at less than 0.5 micrometer under the influence of the interfaces with the cladding layers, and a drop in efficiency would also result at more than 2.0 micrometers due to a decrease in carrier concentration of the active layer 14.
5. It is only the n type cladding layer 3, the active layer 14, and the p type cladding layer 5 that are essential in the illustrated LED, all the other semiconductor layers being optional.
6. The concepts of the present invention are applicable to the elimination of deep emission that conventionally occurred at other than 730 nanometers because of different proportions of aluminum in the active layer.

All these and other modifications and alterations are intended in the foregoing disclosure. It is therefore appropriate that the invention be construed broadly and in a manner consistent with the fair meaning or proper scope of the attached claims.

WHAT IS CLAIMED IS:

1. A light emitting semiconductor element having a semiconductor body having a plurality of laminated semiconductor layers for emitting light, a cathode on one face of the semiconductor body, and an anode on another face of the semiconductor body, wherein the improvement resides in the semiconductor body comprising:

(a) an active layer of AlGaInP semiconductor material additionally containing Zn at a concentration of $1 \times 10^{16}$–$5 \times 10^{17}$ cm$^{-3}$, the active layer being 0.5–2.0 micrometers thick;

(b) an n type cladding layer of either n type AlGaInP or n type AlInP semiconductor material on one side of the active layer; and (c) a p type cladding layer of p type AlGaInP or p type AlInP semiconductor material on another side of the active layer.

2. The light emitting semiconductor element of claim 1 wherein the n type cladding layer is 0.5–1.5 micrometers thick and contains an impurity that determines the conductivity type thereof, at a concentration of $8 \times 10^{16}$–$1 \times 10^{18}$ cm$^{-3}$, and wherein the p type cladding layer is 0.5–1.5 micrometers thick and contains an impurity that determines the conductivity type thereof, at a concentration of $5 \times 10^{16}$–$1 \times 10^{16}$ cm$^{-3}$.

3. A light emitting semiconductor element comprising:

(A) a semiconductor body of laminar construction comprising:

(a) a substrate of n type GaAs semiconductor material;

(b) a buffer layer of n type GaAs semiconductor material;

(c) an n type cladding layer of AlInP semiconductor material;

(d) an active layer of AlGaInP semiconductor material additionally containing Zn at a concentration of $1 \times 10^{16}$–$5 \times 10^{17}$ cm$^{-3}$;

(e) a p type cladding layer of p type AlInP semiconductor material;

(f) a current blocking layer of AlGaInP semiconductor material;

(g) a current spreading layer of p type AlGaAs semiconductor material;

(h) a protective layer of p type AlGaInP semiconductor material; and (i) a contacting layer of p type GaAs semiconductor material;

(B) a cathode formed contiguous to the substrate of the semiconductor body; and (C) an anode formed contiguous to the contacting layer of the semiconductor body.

4. The light emitting semiconductor element of claim 3 wherein the substrate of the semiconductor body contains an impurity that determines the conductivity type thereof, at a concentration of $1 \times 10^{18}$–$4 \times 10^{18}$ cm$^{-3}$, wherein the buffer layer contains an impurity that determines the conductivity type thereof, at a concentration of $1 \times 10^{18} \times 5 \times 10^{18}$ cm$^{-3}$, wherein the n type cladding layer contains an impurity that determines the conductivity type thereof, at a concentration of $8 \times 10^{16}$–$1 \times 10^{18}$ cm$^{-3}$, wherein the p type cladding layer contains an impurity that determines the conductivity type thereof, at a concentration of $5 \times 10^{16}$–$1 \times 10^{18}$ cm$^{-3}$, wherein the current blocking layer contains an impurity that determines the conductivity type thereof, at a concentration of $1 \times 10^{18}$–$1 \times 10^{19}$ cm$^{-3}$, wherein the current spreading layer contains an impurity that determines the conductivity type thereof, at a concentration of $1 \times 10^{18}$–$5 \times 10^{19}$ cm$^{-3}$, wherein the protective layer contains an impurity that determines the conductivity type thereof, at a concentration of $1 \times 10^{17}$–$1 \times 10^{18}$ cm$^{-3}$, and wherein the contacting layer contains an impurity that determines the conductivity type thereof, at a concentration of $5 \times 10^{18}$–$7 \times 10^{19}$ cm$^{-3}$.

5. The light emitting semiconductor element of claim 3 wherein the substrate of the semiconductor body is 330–370 micrometers thick, wherein the buffer layer is 0.1–0.3 micrometer thick, wherein the n type cladding layer is 0.5–1.5 micrometers thick, wherein the active layer is 0.5–2.0 micrometers thick, wherein the p type cladding layer is 0.5–1.5 micrometers thick, wherein the current blocking layer is 0.05–0.25 micrometer thick, wherein the current spreading layer is 5–15 micrometers thick, wherein the protective layer is 0.2–0.4 micrometer thick, and wherein the contacting layer is 0.05–0.15 micrometer thick.

\* \* \* \* \*